United States Patent
Eto et al.

(10) Patent No.: US 12,532,694 B2
(45) Date of Patent: Jan. 20, 2026

(54) SUBSTRATE CLEANING DEVICE AND SUBSTRATE PROCESSING DEVICE

(71) Applicant: EBARA CORPORATION, Tokyo (JP)

(72) Inventors: Yohei Eto, Tokyo (JP); Mitsuru Miyazaki, Tokyo (JP); Hisajiro Nakano, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 650 days.

(21) Appl. No.: 17/828,001

(22) Filed: May 30, 2022

(65) Prior Publication Data
US 2022/0402003 A1    Dec. 22, 2022

(30) Foreign Application Priority Data

Jun. 17, 2021  (JP) .................. 2021-100872

(51) Int. Cl.
*H01L 21/67*      (2006.01)
*H01L 21/687*     (2006.01)

(52) U.S. Cl.
CPC .. *H01L 21/67051* (2013.01); *H01L 21/67219* (2013.01); *H01L 21/67259* (2013.01); *H01L 21/68728* (2013.01)

(58) Field of Classification Search
CPC ........ H01L 21/67028; H01L 21/67046; H01L 21/67092; H01L 21/6715; H01L 21/67219; H01L 21/67253; H01L 21/68728; H01L 21/67051; H01L 21/67259; B08B 13/00; B08B 1/20; B08B 3/022; B24B 37/34; G01P 3/0013; G01P 3/36; G02B 6/02385
See application file for complete search history.

(56) References Cited

U.S. PATENT DOCUMENTS

| | | | | |
|---|---|---|---|---|
| 5,784,802 | A | * | 7/1998 | Thompson ........ H01L 21/67781 34/58 |
| 2005/0175952 | A1 | * | 8/2005 | Toba ................. H01L 21/67109 432/241 |
| 2017/0278729 | A1 | * | 9/2017 | Hayashi .................... B08B 3/08 |
| 2018/0337072 | A1 | * | 11/2018 | Nakano ............ H01L 21/67219 |
| 2019/0193242 | A1 | * | 6/2019 | Takahashi ............... B24B 49/16 |
| 2019/0344399 | A1 | * | 11/2019 | Kinoshita ............. B24B 37/205 |
| 2020/0001424 | A1 | * | 1/2020 | Kimba .................. B24B 37/013 |

FOREIGN PATENT DOCUMENTS

JP    H10289889    10/1998

* cited by examiner

*Primary Examiner* — Kurt Sweely
(74) *Attorney, Agent, or Firm* — JCIPRNET

(57) ABSTRACT

The disclosure provides a substrate cleaning device and a substrate processing device capable of suppressing erroneous rotation detection of an optical sensor due to adhesion of droplets or mist. A substrate cleaning device includes a substrate cleaning part for cleaning a substrate, a drive roller for rotating the substrate, a driven roller rotated by the substrate, and a rotation detection part for detecting rotation of the driven roller. The rotation detection part includes a detected part provided on the driven roller, an optical sensor for detecting rotation of the detected part by irradiation with detection light, and a liquid filling part for filling an optical path forming space in which an optical path of the detection light is formed with a liquid having transmittance.

10 Claims, 7 Drawing Sheets

SUBSTRATE CLEANING DEVICE AND SUBSTRATE PROCESSING DEVICE

CROSS-REFERENCE TO RELATED APPLICATION

This application claims the priority benefit of Japan application serial no. 2021-100872, filed on Jun. 17, 2021. The entirety of the above-mentioned patent application is hereby incorporated by reference herein and made a part of this specification.

BACKGROUND

Technical Field

The disclosure relates to a substrate cleaning device and a substrate processing device.

Description of Related Art

The following Patent Literature 1 discloses a substrate cleaning device for removing a slurry and an excess thin film remaining on the surface of a wafer after a chemical mechanical polishing (CMP) process for polishing a thin film formed on the surface of the wafer. The substrate cleaning device includes a wafer holding device capable of horizontally holding and rotating the wafer, and a disk-type double-sided cleaning device for scrubbing the upper surface and the lower surface of the wafer while supplying the cleaning liquid from the cleaning liquid supply nozzle to the upper surface and the lower surface of the wafer held by the wafer holding device.

The wafer holding device includes a rotation drive source that generates a rotation drive force, a drive roller that transmits the rotation drive force from the rotation drive source to the substrate, a driven roller that rotates according to the rotation of the substrate, and a rotation state detector that detects the rotation state of the driven roller and outputs a rotation stop signal when the rotation is stopped. The rotation state detector includes a slit plate attached to the roller shaft of the driven roller, and a transmissive photoelectric sensor having a light projecting part and a light receiving part disposed to face each other so as to sandwich the peripheral part of the slit plate.

By providing such a rotation state detector, for example, when cleaning the substrate while rotating it, it is possible to detect an event that the substrate slips on the roller and the substrate does not rotate. As a result, it is possible to prevent the substrate from becoming scrap when the substrate is not properly cleaned and is transported to a later process.

RELATED ART

Patent Literature

[Patent Literature 1] Japanese Laid-open Patent No. H10-289889

SUMMARY

Technical Problem

By the way, when an optical sensor is used to detect the rotation of the driven roller as in the above-described conventional technique, the liquid (cleaning liquid or the like) sprayed on the substrate may scatter and adhere to the light irradiation part of the optical sensor or the detected part of the driven roller. In such a case, light may be reflected on the surface of the adhered droplet or refracted when the light is transmitted through the droplet. Further, when the liquid sprayed on the substrate becomes mist, the light may be diffusely reflected by the mist particles and the amount of light received by the optical sensor may decrease. In such a situation, the optical sensor cannot detect the rotation normally, and an erroneous signal is issued, which may lead to hunting or erroneous detection of the rotation speed, and may cause the device process to stop and the device utilization rate to decrease.

The disclosure has been made in view of the above, and the disclosure provides a substrate cleaning device and a substrate processing device capable of suppressing and the erroneous rotation detection of the optical sensor due to the adhesion of droplets or mist.

Solution to Problem

A substrate cleaning device according to an embodiment of the disclosure includes: a substrate cleaning part for cleaning a substrate; a drive roller for rotating the substrate; a driven roller rotated by the substrate; and a rotation detection part for detecting rotation of the driven roller. The rotation detection part includes: a detected part provided on the driven roller; an optical sensor for detecting rotation of the detected part by irradiation with detection light; and a liquid filling part for filling an optical path forming space in which an optical path of the detection light is formed with a liquid having transmittance.

In the above substrate cleaning device, the rotation detection part may be disposed in a substrate cleaning tank in which the substrate is cleaned.

In the above substrate cleaning device, the liquid filling part may include a partition wall part for isolating the optical path forming space from an outside.

The above substrate cleaning device may further include: a liquid supply line for supplying the liquid to the liquid filling part; and a flow rate adjusting valve for adjusting a flow rate of the liquid supplied from the liquid supply line.

In the above substrate cleaning device, the liquid filling part may include a liquid supply port to which the liquid is supplied and a liquid discharge port for discharging the liquid above the optical path forming space.

In the above substrate cleaning device, the liquid filling part may include a liquid supply port to which the liquid is supplied above the optical path forming space and may include a liquid discharge port for discharging the liquid below the optical path forming space.

The above substrate cleaning device may further include a bearing for supporting the driven roller, and the liquid may be supplied to the liquid filling part after passing through the bearing.

In the above substrate cleaning device, the liquid may be pure water.

In the above substrate cleaning device, the optical sensor may be a transmissive optical fiber sensor or a reflective optical fiber sensor.

The above substrate cleaning device may further include an urging part for urging the driven roller toward the substrate.

A substrate processing device according to an embodiment of the disclosure includes: a substrate polishing device for polishing a substrate; and the above-described substrate cleaning device for cleaning the substrate polished by the substrate polishing device.

Effects

According to an embodiment of the disclosure, a substrate cleaning device and a substrate processing device capable of suppressing erroneous rotation detection of an optical sensor due to adhesion of droplets or mist can be provided.

DESCRIPTION OF EMBODIMENTS

Hereinafter, a substrate cleaning device and a substrate transporting device according to an embodiment of the disclosure will be described with reference to the drawings.

Figure 1:
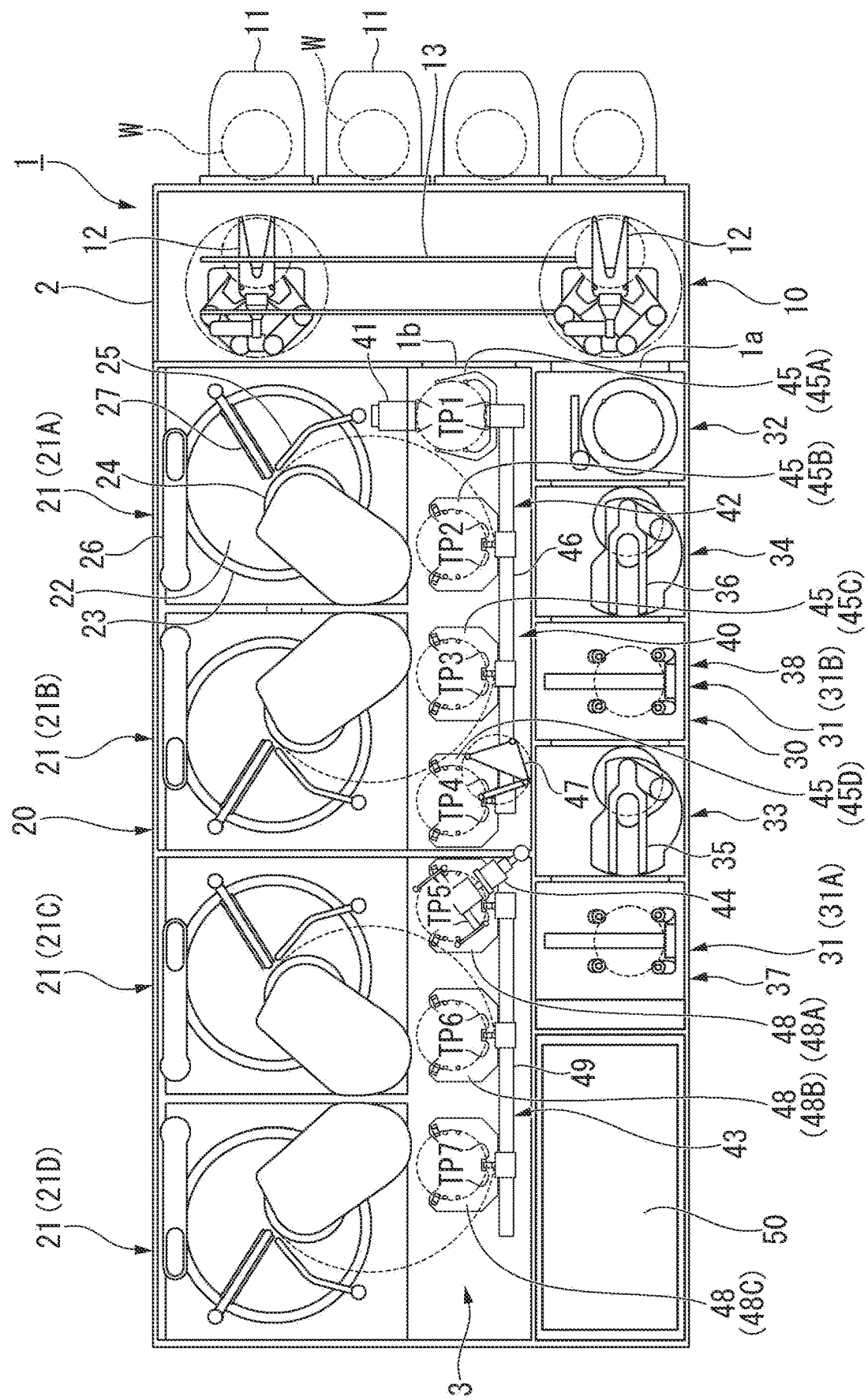
FIG. 1 is a plan view showing an overall configuration of a substrate processing device according to an embodiment.

FIG. 1 is a plan view showing an overall configuration of a substrate processing device 1 according to an embodiment.

The substrate processing device 1 shown in FIG. 1 is a CMP (chemical mechanical polishing) device that polishes to planarize the surface of a substrate W such as a silicon wafer. The substrate processing device 1 includes a rectangular box-shaped housing 2. The housing 2 is formed in a substantially rectangular shape in a plan view.

The housing 2 includes a substrate transporting path 3 extending in the longitudinal direction in the center thereof. A load/unload part 10 is disposed at one end part of the substrate transporting path 3 in the longitudinal direction. A polishing part 20 is disposed on one side of the substrate transporting path 3 in the width direction (direction orthogonal to the longitudinal direction in a plan view), and a cleaning part 30 is disposed on the other side. The substrate transporting path 3 is provided with a substrate transporting part 40 that transports the substrate W. Further, the substrate processing device 1 includes a control part 50 (control panel) that comprehensively controls the operations of the load/unload part 10, the polishing part 20, the cleaning part 30, and the substrate transporting part 40.

The load/unload part 10 includes a front load part 11 that accommodates the substrate W. Multiple front load parts 11 are provided on one side surface of the housing 2 on the one side in the longitudinal direction. The multiple front load parts 11 are arranged in the width direction of the housing 2. The front load part 11 is equipped with, for example, an open cassette, a standard manufacturing interface (SMIF) pod, or a front opening unified pod (FOUP). SMIF and FOUP are airtight containers in which the cassette of the substrate W is housed and covered with a partition wall, and can maintain an environment independent of the external space.

Further, the load/unload part 10 includes two transporting robots 12 that move the substrate W in and out of the front load parts 11, and a traveling mechanism 13 that causes each transporting robot 12 to travel along the front load parts 11. Each transporting robot 12 is provided with two hands on the upper and lower sides, and is used properly before and after the processing of the substrate W. For example, when returning the substrate W to the front load part 11, the upper hand is used, and when taking out the substrate W before the processing from the front load part 11, the lower hand is used.

The polishing part 20 includes multiple substrate polishing devices 21 (21A, 21B, 21C and 21D) for polishing (planarizing) the substrate W. The multiple substrate polishing devices 21 are arranged in the longitudinal direction of the substrate transporting path 3. The substrate polishing device 21 includes a polishing table 23 for rotating a polishing pad 22 having a polishing surface, a top ring 24 for holding the substrate W and pressing the substrate W against the polishing pad 22 on the polishing table 23 for polishing, a polishing liquid supply nozzle 25 for supplying a polishing liquid or a dressing liquid (for example, pure water) to the polishing pad 22, a dresser 26 for dressing the polishing surface of the polishing pad 22, and an atomizer 27 for atomizing a mixed fluid of a liquid (for example, pure water) and a gas (for example, nitrogen gas) or a liquid (for example, pure water) and injecting it onto the polishing surface.

The substrate polishing device 21 polishes the substrate W to planarize the surface thereof by pressing the substrate W against the polishing pad 22 by the top ring 24 while supplying the polishing liquid onto the polishing pad 22 onto the polishing pad 22 from the polishing liquid supply nozzle 25, and relatively moving the top ring 24 and the polishing table 23. The dresser 26 evenly dresses the entire polishing surface of the polishing pad 22 to form a planar polishing surface by making hard particles such as diamond particles or ceramic particles fixed at the rotating part at the tip in contact with the polishing pad 22, and swinging while rotating the rotating part.

The atomizer 27 achieves purification of the polishing surface and sharpening work of the polishing surface by the dresser 26 which is a mechanical contact, that is, achieves regeneration of the polishing surface by washing away the polishing debris, abrasive grains and the like remaining on the polishing surface of the polishing pad 22 with a high-pressure fluid.

The cleaning part 30 includes multiple substrate cleaning devices 31 (31A and 31B) for cleaning the substrate W, and a substrate drying device 32 for drying the cleaned substrate W. The multiple substrate cleaning devices 31 and the substrate drying device 32 are arranged in the longitudinal direction of the substrate transporting path 3. The substrate cleaning device 31A is provided in a first substrate cleaning tank 37. Further, the substrate cleaning device 31B is provided in a second substrate cleaning tank 38.

A first transporting chamber 33 is provided between the first substrate cleaning tank 37 and the second substrate cleaning tank 38. The first transporting chamber 33 is provided with a transporting robot 35 which transports the substrate W between the substrate transporting part 40, the substrate cleaning device 31A, and the substrate cleaning device 31B. Further, a second transporting chamber 34 is provided between the substrate cleaning device 31B and the substrate drying device 32. The second transporting chamber 34 is provided with a transporting robot 36 which transports the substrate W between the substrate cleaning device 31B and the substrate drying device 32.

The substrate cleaning device 31A includes, for example, a roll sponge type cleaning module to perform primary cleaning of the substrate W. Further, the substrate cleaning device 31B also includes a roll sponge type cleaning module to perform secondary cleaning of the substrate W. The substrate cleaning device 31A and the substrate cleaning device 31B may include the same type or different types of cleaning modules, and may include, for example, pencil sponge type cleaning modules or two-fluid jet type cleaning modules. The substrate drying device 32 includes, for example, a drying module for performing Rotagoni drying (iso-propyl alcohol (IPA) drying). After drying, a shutter 1*a* provided on the partition wall between the substrate drying device 32 and the load/unload part 10 is opened, and the substrate W is taken out from the substrate drying device 32 by the transporting robot 12.

The substrate transporting part 40 includes a lifter 41, a first linear transporter 42, a second linear transporter 43, and a swing transporter 44. In the substrate transporting path 3, a first transporting position TP1, a second transporting position TP2, a third transporting position TP3, a fourth transporting position TP4, a fifth transporting position TP5, a sixth transporting position TP6, and a seventh transporting position TP7 are sequentially set from the load/unload part 10 side.

The lifter 41 is a mechanism for transporting the substrate W up and down at the first transporting position TP1. The lifter 41 receives the substrate W from the transporting robot 12 of the load/unload part 10 at the first transporting position TP1. Further, the lifter 41 transfers the substrate W received from the transporting robot 12 to the first linear transporter 42. A shutter 1*b* is provided on the partition wall between the first transporting position TP1 and the load/unload part 10. When the substrate W is being transported, the shutter 1*b* is opened, and the substrate W is received from the transporting robot 12 to the lifter 41.

The first linear transporter 42 is a mechanism for transporting the substrate W between the first transporting position TP1, the second transporting position TP2, the third transporting position TP3, and the fourth transporting position TP4. The first linear transporter 42 includes multiple transporting hands 45 (45A, 45B, 45C and 45D) and a linear guide mechanism 46 for horizontally moving each transporting hand 45 at different heights.

The transporting hand 45A moves between the first transporting position TP1 and the fourth transporting position TP4 by the linear guide mechanism 46. The transporting hand 45A is a pass hand for receiving the substrate W from the lifter 41 and transferring it to the second linear transporter 43. The transporting hand 45A is not provided with a lifting drive part.

The transporting hand 45B moves between the first transporting position TP1 and the second transporting position TP2 by the linear guide mechanism 46. The transporting hand 45B receives the substrate W from the lifter 41 at the first transporting position TP1 and transfers the substrate W to the substrate polishing device 21A at the second transporting position TP2. The transporting hand 45B is provided with a lifting drive part, is lifted when the substrate W is transferred to the top ring 24 of the substrate polishing device 21A, and is lowered after the substrate W is transferred to the top ring 24. The transporting hand 45C and the transporting hand 45D are also provided with a similar lifting drive part.

The transporting hand 45C moves between the first transporting position TP1 and the third transporting position TP3 by the linear guide mechanism 46. The transporting hand 45C receives the substrate W from the lifter 41 at the first transporting position TP1 and transfers the substrate W to the substrate polishing device 21B at the third transporting position TP3. Further, the transporting hand 45C also functions as an access hand that receives the substrate W from the top ring 24 of the substrate polishing device 21A at the second transporting position TP2 and transfers the substrate W to the substrate polishing device 21B at the third transporting position TP3.

The transporting hand 45D moves between the second transporting position TP2 and the fourth transporting position TP4 by the linear guide mechanism 46. The transporting hand 45D functions as an access hand that receives the substrate W from the top ring 24 of the substrate polishing device 21A or the substrate polishing device 21B at the second transporting position TP2 or the third transporting position TP3, and transfers the substrate W to the swing transporter 44 at the fourth transporting position TP4.

The swing transporter 44 has a hand that can move between the fourth transporting position TP4 and the fifth transporting position TP5, and transfers the substrate W from the first linear transporter 42 to the second linear transporter 43. Further, the swing transporter 44 transfers the substrate W polished by the polishing part 20 to the cleaning part 30. A temporary storage table 47 for the substrate W is provided on a side of the swing transporter 44. The swing transporter 44 flips the substrate W received at the fourth transporting position TP4 or the fifth transporting position TP5 upside down and places it on the temporary storage table 47. The substrate W placed on the temporary storage table 47 is transported to the first transporting chamber 33 by the transporting robot 35 of the cleaning part 30.

The second linear transporter 43 is a mechanism for transporting the substrate W between the fifth transporting position TP5, the sixth transporting position TP6, and the seventh transporting position TP7. The second linear transporter 43 includes multiple transporting hands 48 (48A, 48B and 48C) and a linear guide mechanism 49 for horizontally moving each transporting hand 48 at different heights. The transporting hand 48A moves between the fifth transporting position TP5 and the sixth transporting position TP6 by the linear guide mechanism 49. The transporting hand 45A functions as an access hand that receives the substrate W from the swing transporter 44 and transfers the substrate W to the substrate polishing device 21C.

The transporting hand 48B moves between the sixth transporting position TP6 and the seventh transporting position TP7. The transporting hand 48B functions as an access hand that receives the substrate W from the substrate polishing device 21C and transfers the substrate W to the substrate polishing device 21D. The transporting hand 48C moves between the seventh transporting position TP7 and the fifth transporting position TP5. The transporting hand 48C functions as an access hand that receives the substrate W from the top ring 24 of the substrate polishing device 21C or the substrate polishing device 21D at the sixth transporting position TP6 or the seventh transporting position TP7, and transfers the substrate W to the swing transporter 44 at the fifth transporting position TP5. Although the description is omitted, the operation of the transporting hand 48 at the time of transfer of the substrate W is the same as the operation of the first linear transporter 42 described above.

Figure 2:
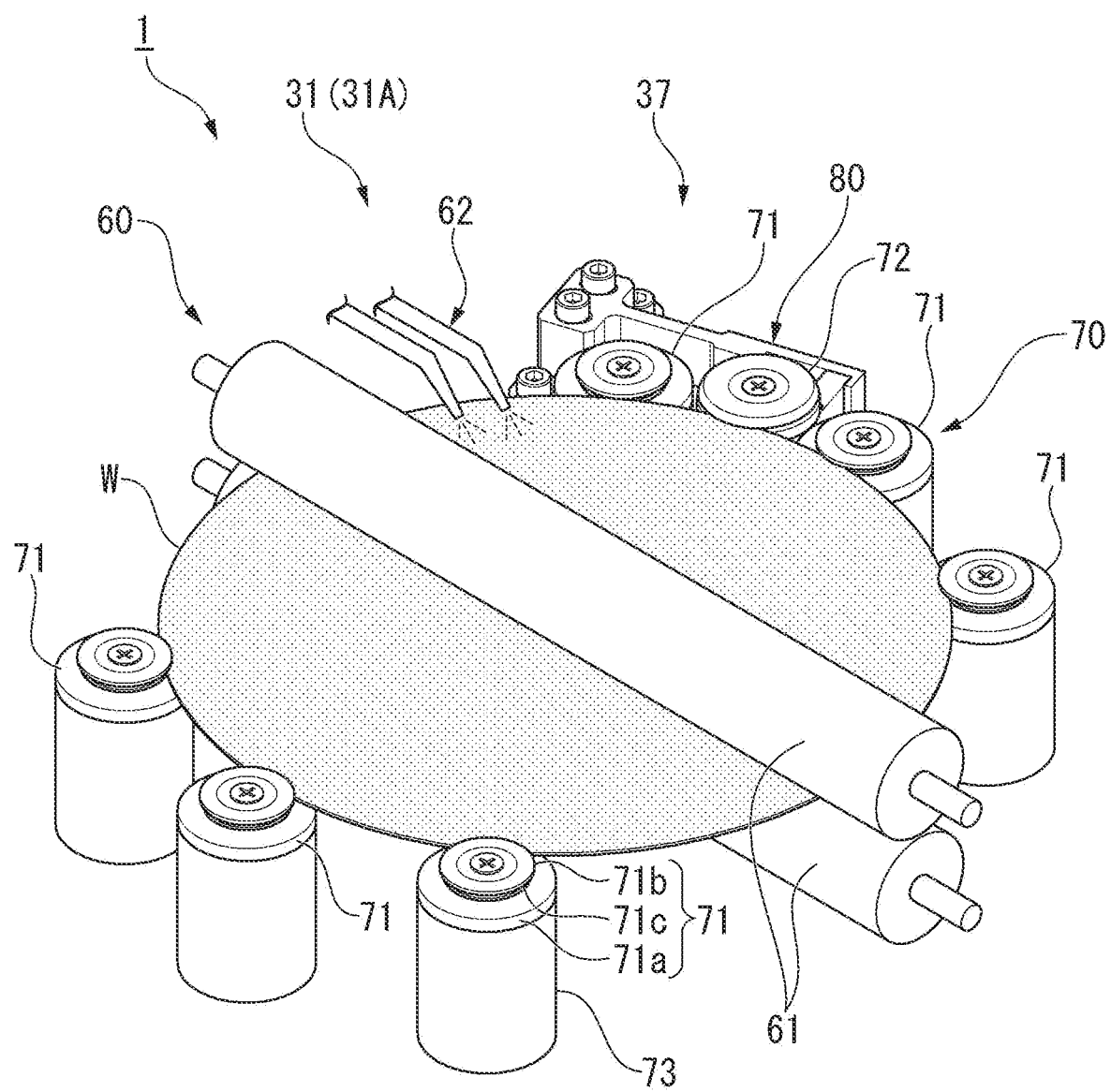
FIG. 2 is a perspective view showing a configuration of the substrate cleaning device according to an embodiment.

FIG. 2 is a perspective view showing a configuration of the substrate cleaning device 31 according to an embodiment.

As shown in FIG. 2, the substrate cleaning device 31 includes a substrate cleaning part 60 for cleaning the substrate W and a substrate holding and rotating part 70 for holding and rotating the substrate W. The substrate cleaning part 60 includes a roll cleaning member 61 that rotates in contact with the substrate W, and a liquid supply nozzle 62 that supplies liquid to the substrate W.

The peripheral surface of the roll cleaning member 61 is formed of, for example, a polyvinyl alcohol (PVA) sponge or a urethane sponge. A pair of roll cleaning members 61 are provided to be in contact with the front surface (polished surface) of the substrate W and the back surface of the substrate W. The pair of roll cleaning members 61 are connected to an electric drive part such as a motor (not shown) to rotate.

The upper roll cleaning member 61 that comes into contact with the front surface of the substrate W is configured to be movable up and down by an air drive part such as an air cylinder (not shown). The lower roll cleaning member 61 that contacts the back surface of the substrate W may be held at a constant height. The liquid supply nozzle 62 supplies a cleaning liquid, pure water, or the like to the substrate W. As the cleaning liquid, SC1 (ammonia/hydrogen peroxide mixed aqueous solution) or the like can be used.

The substrate holding and rotating part 70 includes multiple (six in this embodiment) drive rollers 71 for rotating the substrate W, and a driven roller 72 rotated by the substrate W. The drive roller 71 and the driven roller 72 have a groove shape for holding the peripheral edge part of the substrate W.

Specifically, the drive roller 71 includes a roller lower part 71a facing the back surface of the peripheral edge part of the substrate W, a roller upper part 71b facing the front surface of the peripheral edge part of the substrate W, and a clamp groove 71c which is provided between the roller lower part 71a and the roller upper part 71b and into which the peripheral edge part of the substrate W is inserted.

The drive roller 71 is provided at the upper end of a support column part 73. The drive roller 71 is configured to be horizontally rotatable by an electric drive part such as a motor (not shown) provided on the support column part 73. Further, the drive roller 71 is configured to be movable up and down by an air drive unit part as an air cylinder (not shown) provided on the support column part 73.

Figure 3:
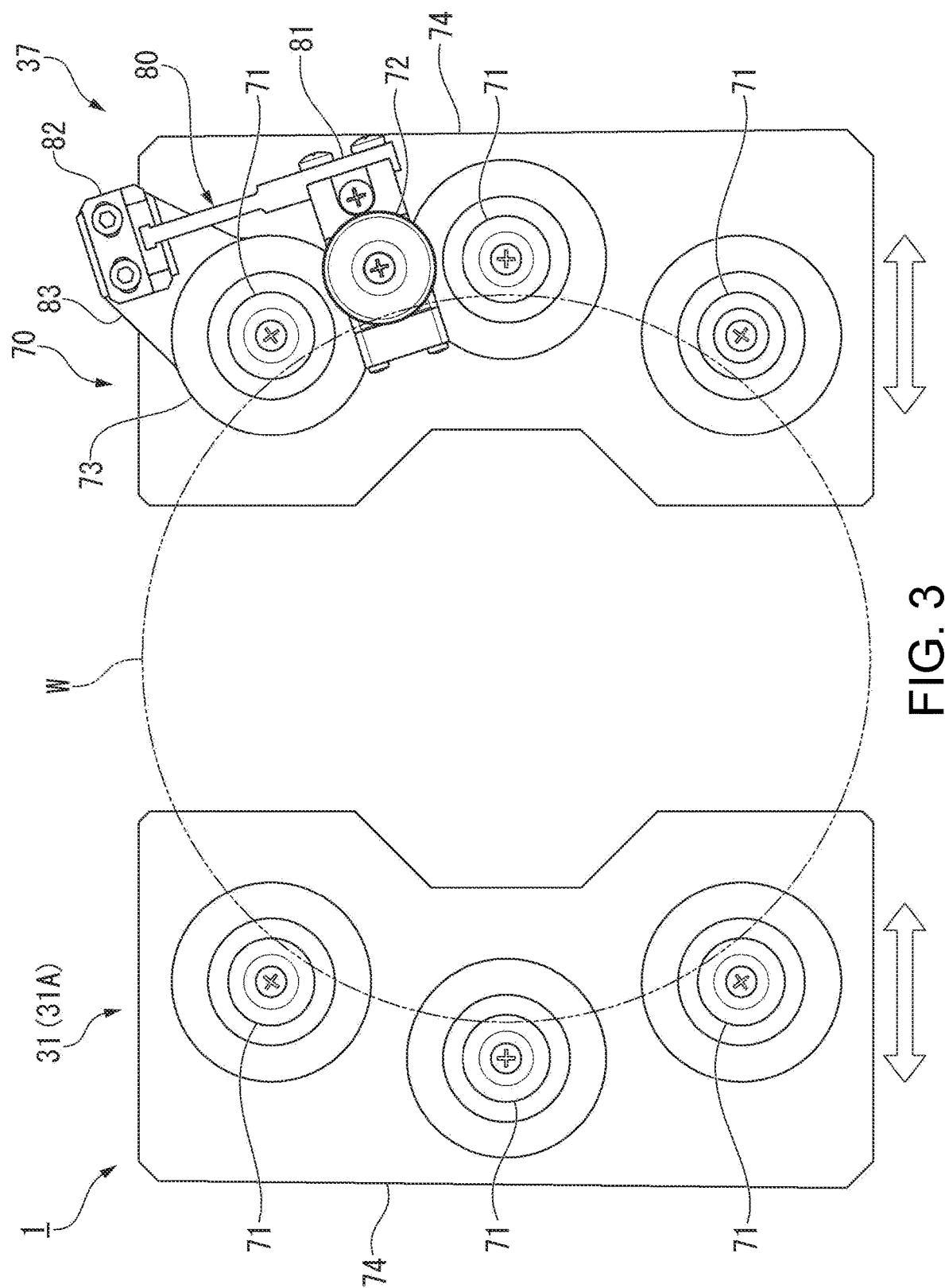
FIG. 3 is a plan view showing a configuration of the substrate holding and rotating part according to an embodiment.

FIG. 3 is a plan view showing a configuration of the substrate holding and rotating part 70 according to an embodiment.

As shown in FIG. 3, the drive rollers 71 are connected to two left and right connecting plates 74 by a group of three each, and are configured to be movable close to and away from the substrate W horizontally. The two connecting plates 74 are configured to be movable to the left and right by an air drive part such as an air cylinder (not shown).

According to the above configuration, the substrate W can be held by the multiple drive rollers 71 and the driven roller 72 by moving the two connecting plates 74 close to each other. Further, by moving the two connecting plates 74 away from each other, the holding of the substrate W by the multiple driving rollers 71 and the driven roller 72 can be released.

The driven roller 72 is disposed between the adjacent drive rollers 71. The driven roller 72 is supported by an urging part 80. The urging part 80 includes a leaf spring part 81 that urges the driven roller 72 toward the substrate W, a column part 82 that supports the leaf spring part 81, and a connecting part 83 for connecting the column part 82 to the support column part 73 of the drive roller 71.

Figure 4:
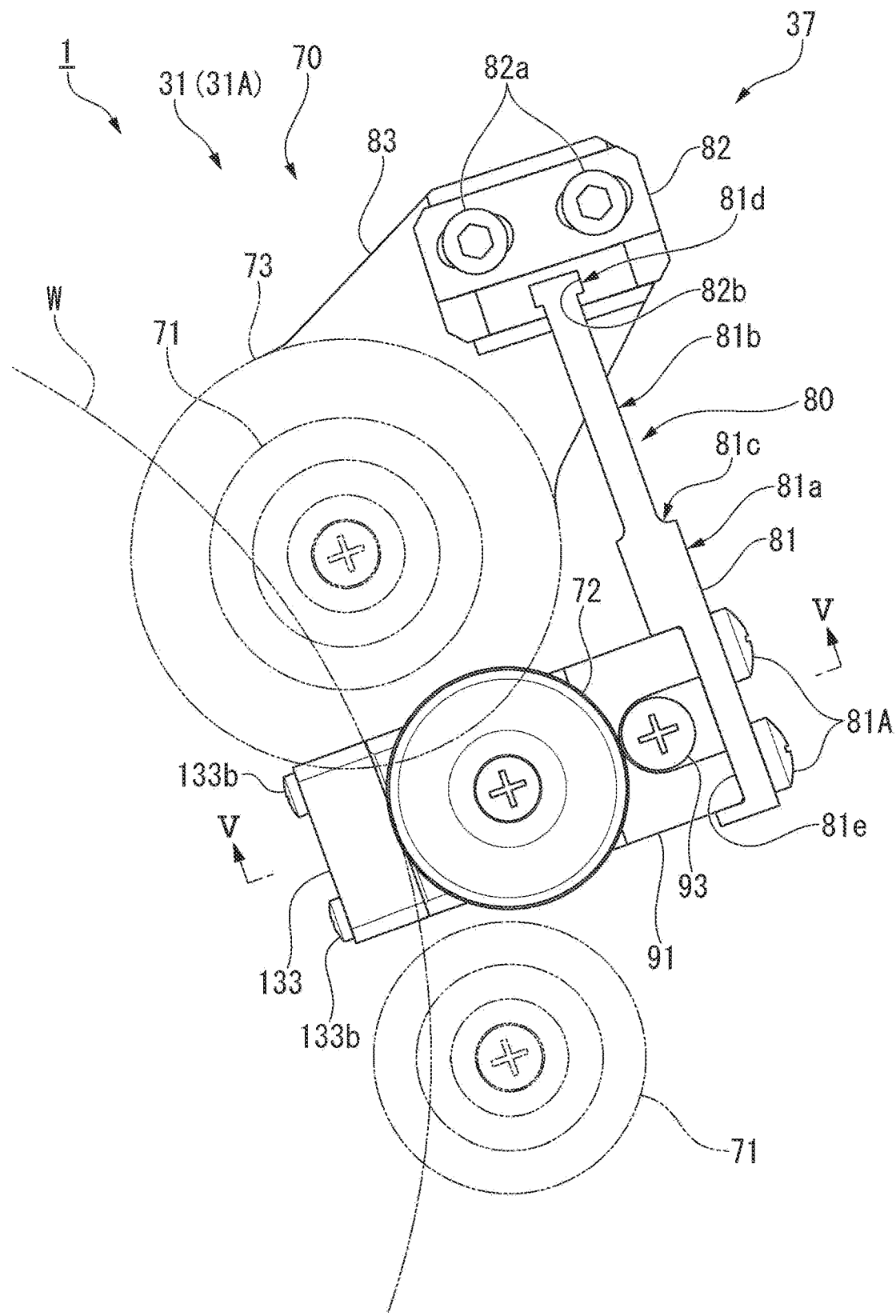
FIG. 4 is a plan view showing a configuration of the driven roller and the urging part according to an embodiment.

FIG. 4 is a plan view showing a configuration of the driven roller 72 and the urging part 80 according to an embodiment.

As shown in FIG. 4, a bearing housing 91 that supports the driven roller 72 is fixed to the leaf spring part 81 at the tip end part via a screw member 81A. The leaf spring part 81 includes a first part 81a to which the bearing housing 91 is fixed, and a second part 81b connected to the first part 81a and fixed to the column part 82.

An engaging groove 81e with which the bearing housing 91 is engaged is formed in the first part 81a. The second part 81b is thinner than the first part 81a, which facilitates elastic deformation. An R for relaxing stress concentration is formed in a step part 81c between the first part 81a and the second part 81b.

A T-shaped fitting protrusion 81d is formed at the end of the second part 81b on the column part 82 side (base end part of the leaf spring part 81). In addition, the column part 82 is formed with a T-shaped fitting groove 82d into which the fitting protrusion 81d is fitted. The column part 82 is fixed to the connecting part 83 via a screw member 82a. The connection part 83 is fixed to the support column part 73 of the drive roller 71.

Figure 5:
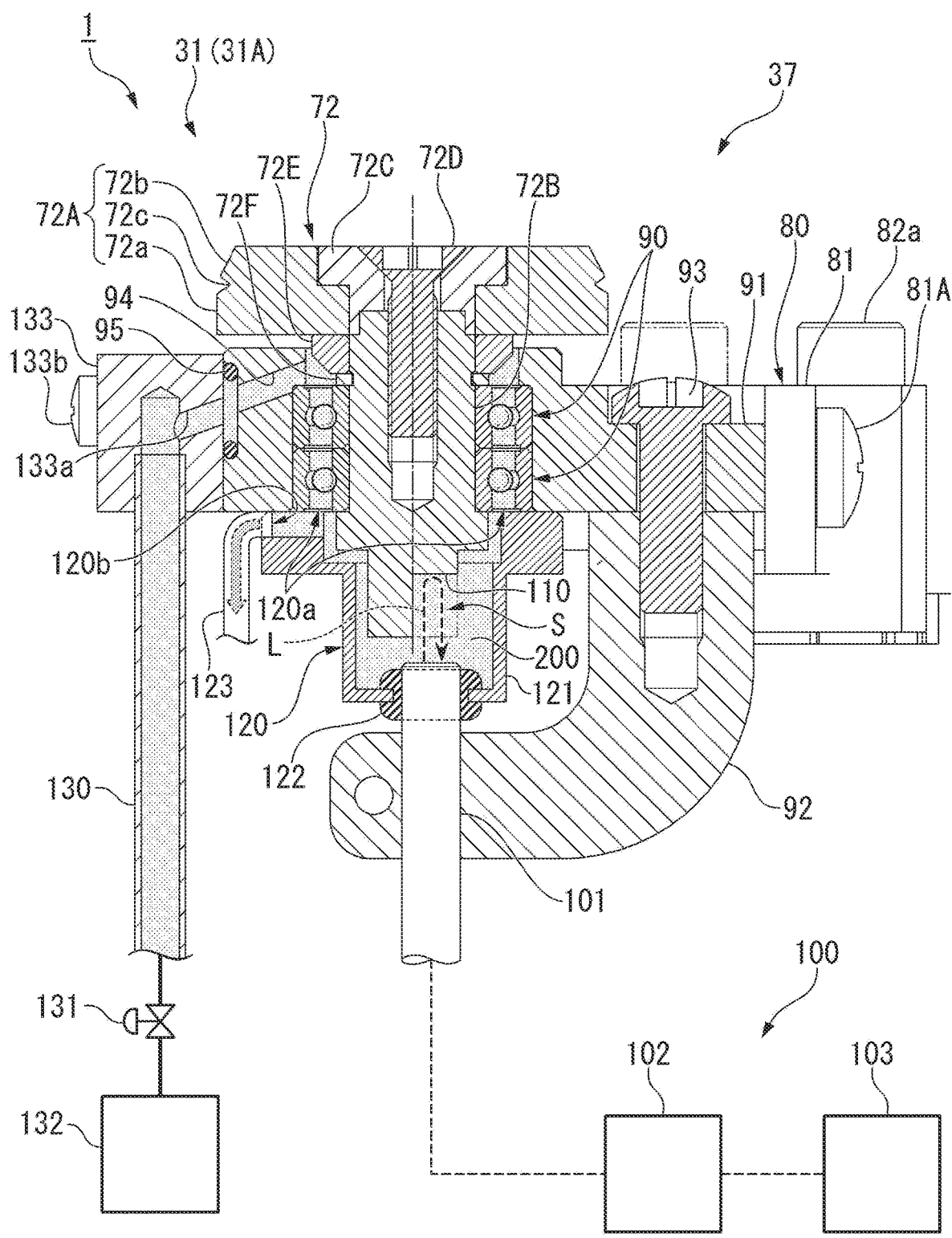
FIG. 5 is a cross-sectional view taken along the arrow V-V shown in FIG. 4.

FIG. 5 is a cross-sectional view taken along the arrow V-V shown in FIG. 4.

As shown in FIG. 5, the driven roller 72 includes a roller body 72A, a rotating shaft 72B, a roller fixing part 72C, a screw member 72D, and a nut member 72E.

The roller body 72A is formed in an annular shape. On the outer peripheral surface of the roller body 72A, a roller lower part 72a facing the back surface of the peripheral edge part of the substrate W, a roller upper part 72b facing the front surface of the peripheral edge part of the substrate W, and a clamp groove 72c which is provided between the roller lower part 72a and the roller upper part 72b and into which the peripheral edge part of the substrate W is inserted are provided.

The roller fixing part 72C is fixed to the upper end of the rotating shaft 72B by the screw member 72D. The nut member 72E is screwed onto the outer peripheral surface near the upper end of the rotating shaft 72B. The roller body 72A is fixed to the rotating shaft 72B by being sandwiched between the roller fixing part 72C and the nut member 72E.

The rotating shaft 72B is rotatably supported by multiple bearings 90. The inner ring of the bearing 90 is fixed to the rotating shaft 72B side. A fixing ring 72F for fixing the inner ring of the bearing 90 is fitted on the peripheral surface of the rotating shaft 72B. The outer ring of the bearing 90 is fixed to the bearing housing 91 side. A rolling body (ball) is interposed between the inner ring and the outer ring of the bearing 90 and rotates the inner ring and the outer ring relative to each other.

An optical sensor 101 is disposed in the lower part of the bearing housing 91. The optical sensor 101 is a reflective optical fiber sensor, and is connected to a fiber sensor amplifier 102 and a speed indicator 103 that displays the rotation speed of the driven roller 72. The optical sensor 101 configures a rotation detection part 100 that detects the rotation of the driven roller 72.

The rotation detection part 100 includes a detected part 110 provided on the driven roller 72, the optical sensor 101 that detects the rotation of the detected part 110 by irradiation with detection light L, and a liquid filling part 120 that fills an optical path forming space S in which the optical path of the detection light L is formed with a liquid 200 having transmittance. The rotation detection part 100 is disposed in the substrate cleaning tank 37 in which the substrate W is cleaned. The fiber sensor amplifier 102 and the speed indicator 103 may be disposed outside the substrate cleaning tank 37.

The detected part 110 is a groove or a protrusion (it is a groove in this embodiment) provided at the lower end of the rotating shaft 72B of the driven roller 72. The detected part 110 is disposed at a radial position that passes directly above the optical sensor 101 due to the rotation of the rotating shaft 72B.

The optical sensor 101 includes a light-projecting optical fiber (not shown) that projects the detection light L directly above, and a light-receiving optical fiber (not shown) that receives the detection light L reflected at the lower end of the rotating shaft 72B, and detects the passage of the detected part 110. The fiber sensor amplifier 102 amplifies the light reception signal of the optical sensor 101, and the speed indicator 103 calculates the rotation speed of the driven roller 72 based on the signal.

The liquid filling part 120 includes a partition wall part 121 that isolates the optical path forming space S of the detection light L from the outside. The optical path forming space S is a gap space between the optical sensor 101 and the rotating shaft 72B through which the detection light L travels. The partition wall part 121 is formed in a bottomed cylindrical shape, is connected to the lower part of the bearing housing 91, and surrounds the lower end of the rotating shaft 72B with a gap. The inside of the partition wall part 121 is filled with the liquid 200 having transmittance. The liquid 200 is, for example, pure water, but may be any colorless and transparent liquid.

The optical sensor 101 is disposed to penetrate the bottom part of the partition wall part 121. The gap between the partition wall part 121 and the optical sensor 101 is liquid-tightly sealed by an annular seal member 122. The peripheral wall part extending upward from the peripheral edge part of the bottom part of the partition wall part 121 extends above the optical path forming space S. The upper end of the peripheral wall part of the partition wall part 121 is connected to the lower surface of the bearing housing 91 and sandwiches the outer ring of the bearing 90 with the bearing housing 91.

An L-shaped support member 92 that supports the optical sensor 101 below the partition wall part 121 is fixed to the bearing housing 91 by a screw member 93. Further, a through flow path 94 penetrating to the upper part of the bearing 90 is opened on the side surface of the bearing housing 91. An annular seal member 95 is disposed around the opening of the through flow path 94 on the side surface of the bearing housing 91.

A liquid supply block 133 in which a communication flow path 133*a* communicating with the through flow path 94 is formed on the side surface of the bearing housing 91 and is fixed by a screw member 133*b*. A liquid supply line 130 for supplying the liquid 200 is connected to the liquid supply block 133. The liquid supply line 130 is provided with a flow rate adjusting valve 131 for adjusting the flow rate of the liquid 200.

The liquid supply line 130 is connected to a liquid supply source 132. The liquid supply source 132 includes a tank (not shown) for storing the liquid 200 and a pump (not shown) for supplying the liquid 200 from the tank to the liquid supply line 130. The liquid supply source 132 may be a shared part with, for example, a liquid supply source that supplies pure water to the liquid supply nozzle 62 or the like described above.

The liquid 200 supplied from the liquid supply line 130 to the liquid supply block 133 reaches the upper part of the bearing 90 from the communication flow path 133*a* through the through flow path 94 of the bearing housing 91, passes through the bearing 90, and then is supplied to the liquid filling part 120. That is, the liquid 200 of this embodiment is also used as a refrigerant for cooling the bearing 90.

The liquid filling part 120 includes a liquid supply port 120*a* to which the liquid 200 is supplied and a liquid discharge port 120*b* for discharging the liquid 200 above the optical path forming space S. The liquid supply port 120*a* is a gap between the inner ring and the outer ring of the bearing 90. The liquid discharge port 120*b* is formed near of the connecting position between the partition wall part 121 and the bearing housing 91. A liquid discharge pipe 123 is connected to the liquid discharge port 120*b*.

The substrate cleaning device 31 of the above-described embodiment includes the substrate cleaning part 60 for cleaning the substrate W, the drive roller 71 for rotating the substrate W, the driven roller 72 rotated by the substrate W, and the rotation detection part 100 for detecting the rotation of the driven roller 72; and the rotation detection part 100 includes the detected part 110 provided on the driven roller 72, the optical sensor 101 that detects the rotation of the detected part 110 by irradiation with the detection light L, and the liquid filling part 120 that fills the optical path forming space S in which the optical path of the detection light L is formed with the liquid 200 having transmittance. According to this configuration, since the optical path of the detection light L is filled with the liquid 200 having transmittance, the rotation detection environment of the optical sensor 101 becomes constant and is not affected even if the liquid sprayed on the substrate W by the cleaning process is scattered or turned into mist. Therefore, it is possible to suppress the erroneous rotation detection of the optical sensor 101.

Further, in this embodiment, the rotation detection part 100 is disposed in the substrate cleaning tank 37 in which the substrate W is cleaned. If the rotation detection part 100 is disposed outside the substrate cleaning tank 37, for example, it is necessary to lengthen the rotating shaft 72B of the driven roller 72 to extend it to the outside of the substrate cleaning tank 37; if so, the moment of inertia of the driven roller 72 becomes large and the driven roller 72 becomes difficult to rotate, whereby slip with the substrate W is likely to occur. In contrast, when the rotation detection part 100 is disposed in the substrate cleaning tank 37 as in this embodiment, the rotating shaft 72B of the driven roller 72 can be shortened, the driven roller 72 can be easily rotated, and the driven roller 72 can be easily rotated, and slip with the substrate W is unlikely to occur. That is, the rotation of the substrate W can be detected accurately.

Further, in this embodiment, the liquid filling part 120 includes the partition wall part 121 that isolates the optical path forming space S from the outside. According to this configuration, since it is possible to prevent an external liquid (cleaning liquid or the like) from being mixed into the liquid 200 that fills the optical path forming space S, the rotation detection environment of the optical sensor 101 is constant and does not change, and the rotation of the substrate W can be detected accurately.

Further, in this embodiment, the liquid supply line 130 for supplying the liquid 200 to the liquid filling part 120 and a flow rate adjusting valve 131 for adjusting the flow rate of the liquid 200 supplied from the liquid supply line 130 are provided. According to this configuration, the supply amount of the liquid 200 to the liquid filling part 120 can be adjusted. The liquid 200 may be continuously supplied to the liquid filling part 120 during the cleaning process of the substrate W.

Further, in this embodiment, the liquid filling part 120 includes the liquid supply port 120a to which the liquid 200 is supplied and the liquid discharge port 120b for discharging the liquid 200 above the optical path forming space S. According to this configuration, since the liquid 200 is accumulated in the liquid filling part 120, the optical path forming space S can always be filled with the liquid 200 without the liquid 200 being continuously supplied. If the liquid 200 is not supplied at all, the liquid 200 accumulated in the liquid filling part 120 may deteriorate and become turbid. Therefore, during the cleaning process of the substrate W or the dummy dispense of the substrate cleaning device 31 (periodic discharge of chemical solutions and/or pure water accumulated in the piping system for cleaning the substrate W), it is preferable to supply the liquid 200 to the liquid filling part 120 and replace the liquid 200.

Further, in this embodiment, the bearing 90 for supporting the driven roller 72 is provided, and the liquid 200 is supplied to the liquid filling part 120 after passing through the bearing 90. According to this configuration, the liquid 200 can be supplied to the liquid filling part 120 while cooling the bearing 90.

Further, in this embodiment, the liquid 200 is pure water. According to this configuration, since pure water that is also used in the cleaning process of the substrate W can be diverted, it is not necessary to add a separate pure water tank, pump, or the like. Further, the liquid 200 may be not only pure water but also tap water or the like, and may be colorless and transparent oil or the like instead of water.

Further, in this embodiment, the optical sensor 101 is a reflective optical fiber sensor. According to this configuration, it is possible to suppress the erroneous rotation detection of the reflective optical fiber sensor.

Further, in this embodiment, the urging part 80 for urging the driven roller 72 toward the substrate W is provided. According to this configuration, since the frictional force between the substrate W and the driven roller 72 is high, the substrate W is less likely to slip on the surface of the driven roller 72.

The substrate processing device 1 according to an aspect of this embodiment includes the substrate polishing device 21 for polishing the substrate W and the substrate cleaning device 31 for cleaning the substrate W polished by the substrate polishing device 21. According to this configuration, the substrate processing device 1 capable of suppressing erroneous rotation detection of the optical sensor 101 due to adhesion of droplets or mist can be obtained.

Although exemplary embodiments of the disclosure have been described and described above, it should be understood that these are for illustration and should not be considered as limiting the disclosure. Additions, omissions, replacements, and other modifications may be made without departing from the scope of the disclosure. Therefore, the disclosure should not be considered limited by the above description, but is defined by the claims.

For example, the configurations shown in FIGS. 6 and 7 below may be adopted. In the following description, the same or equivalent configurations as those in the above-described embodiments are designated by the same reference numerals, and the description thereof will be simplified or omitted.

Figure 6:
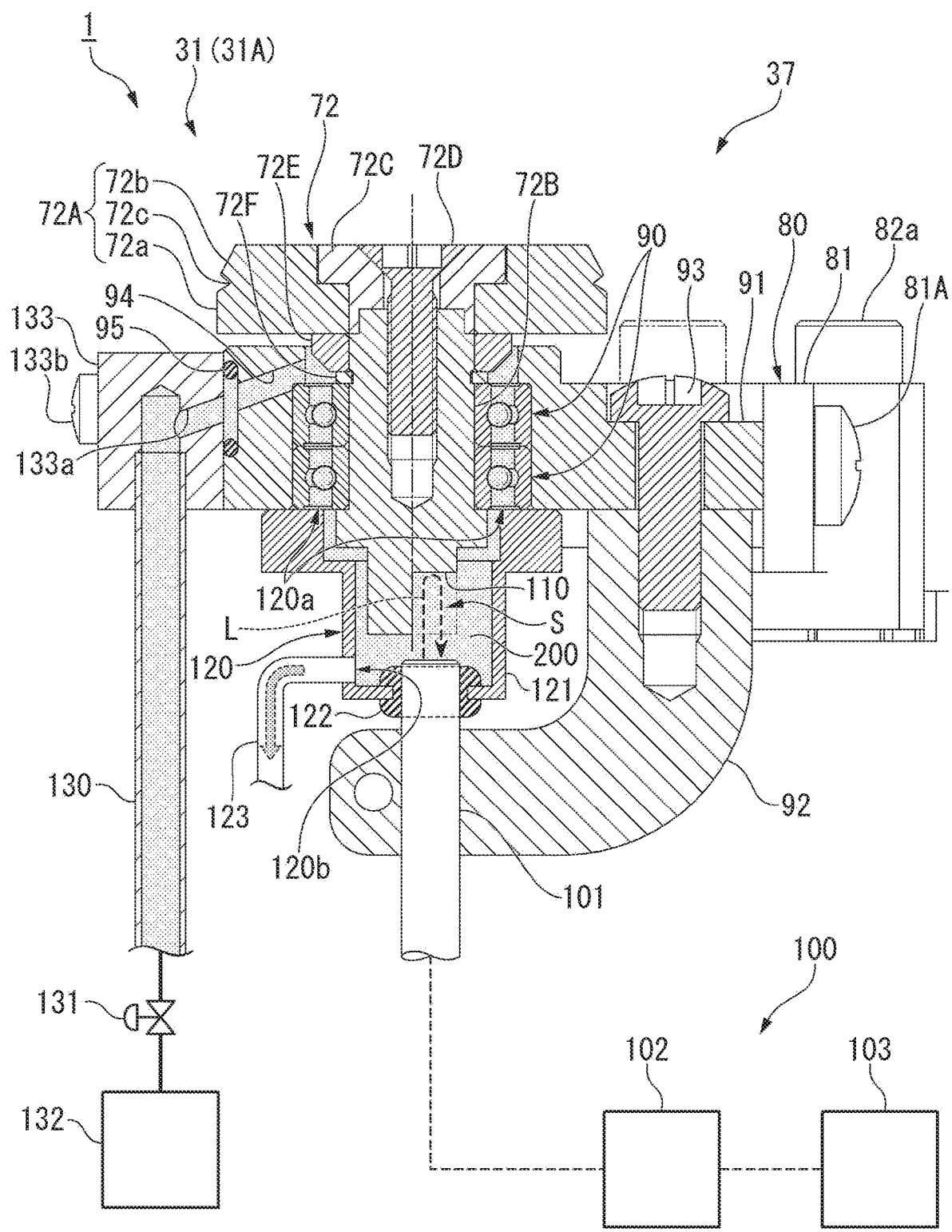
FIG. 6 is a cross-sectional configuration view of the liquid filling part according to a modified example of an embodiment.

FIG. 6 is a cross-sectional configuration view of the liquid filling part 120 according to a modified example of an embodiment.

As shown in FIG. 6, the liquid filling part 120 may include the liquid supply port 120a to which the liquid 200 is supplied above the optical path forming space S, and may include the liquid discharge port 120b for discharging the liquid 200 below the optical path forming space S.

In the modified example shown in FIG. 6, the liquid discharge port 120b is provided near the bottom surface of the partition wall part 121 in a bottomed cylindrical shape. According to this configuration, the liquid 200 inside the partition wall part 121 can be replaced in a short time as compared with the configuration shown in FIG. 5.

Figure 7:
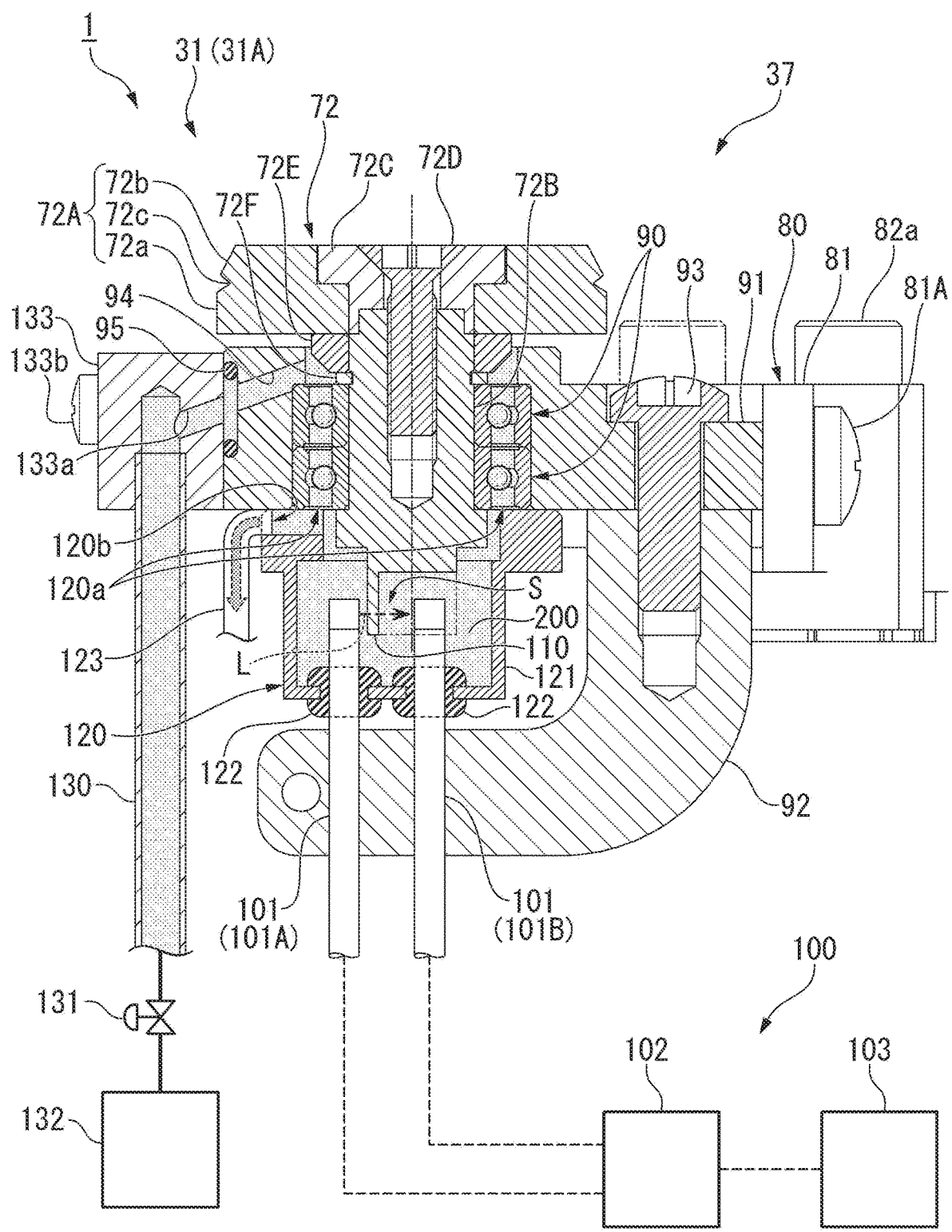
FIG. 7 is a cross-sectional configuration view of the liquid filling part according to a modified example of an embodiment.

FIG. 7 is a cross-sectional configuration view of the liquid filling part 120 according to a modified example of an embodiment.

As shown in FIG. 7, a transmissive optical fiber sensor may be disposed as the optical sensor 101 in the liquid filling part 120.

In the modified example shown in FIG. 7, a light-projecting optical sensor 101A for projecting the detection light L and a light-receiving optical sensor 101B for receiving the detection light L are disposed in the liquid filling part 120. The light-projecting optical sensor 101A and the light-receiving optical sensor 101B are disposed to face each other with the detected part 110 (protrusion) provided on the driven roller 72 interposed therebetween.

Even with the configuration shown in FIG. 7, by filling the optical path forming space S in which the optical path of the detection light L is formed with the liquid 200 having transmittance, it is possible to suppress the erroneous rotation detection of the optical sensor 101.

What is claimed is:

1. A substrate cleaning device comprising:
a substrate cleaning part for cleaning a substrate;
a drive roller for rotating the substrate;
a driven roller rotated by the substrate;
a bearing for supporting the driven roller; and
a rotation detection part for detecting rotation of the driven roller,
wherein the rotation detection part comprises:
a detected part provided on the driven roller;
an optical sensor for detecting rotation of the detected part by irradiation with detection light; and
a liquid filling part for filling an optical path forming space in which an optical path of the detection light is formed with a liquid having transmittance,
wherein the liquid is supplied to the liquid filling part after passing through the bearing.

2. The substrate cleaning device according to claim 1, wherein the rotation detection part is disposed in a substrate cleaning tank in which the substrate is cleaned.

3. The substrate cleaning device according to claim 1, wherein the liquid filling part comprises a partition wall part for isolating the optical path forming space from an outside.

4. The substrate cleaning device according to claim 1, further comprising:
a liquid supply line for supplying the liquid to the liquid filling part; and
a flow rate adjusting valve for adjusting a flow rate of the liquid supplied from the liquid supply line.

5. The substrate cleaning device according to claim 1, wherein the liquid filling part comprises a liquid supply port to which the liquid is supplied and a liquid discharge port for discharging the liquid above the optical path forming space.

6. The substrate cleaning device according to claim 1, wherein the liquid filling part comprises a liquid supply port to which the liquid is supplied above the optical path forming space and comprises a liquid discharge port for discharging the liquid below the optical path forming space.

7. The substrate cleaning device according to claim 1, wherein the liquid is pure water.

8. The substrate cleaning device according to claim 1, wherein the optical sensor is a transmissive optical fiber sensor or a reflective optical fiber sensor.

9. The substrate cleaning device according to claim 1, further comprising an urging part for urging the driven roller toward the substrate.

10. A substrate processing device comprising:
a substrate polishing device for polishing a substrate; and
the substrate cleaning device according to claim 1 for cleaning the substrate polished by the substrate polishing device.

* * * * *